United States Patent [19]
Reimer

[11] 3,808,505
[45] Apr. 30, 1974

[54] APPARATUS FOR INTERCONNECTING A PLURALITY OF ELECTRONIC EQUIPMENT FRAMES

[75] Inventor: William A. Reimer, Wheaton, Ill.

[73] Assignee: GTE Automatic Electric Laboratories Incorporated, Northlake, Ill.

[22] Filed: Mar. 19, 1973

[21] Appl. No.: 342,915

[52] U.S. Cl...... 317/101 DH, 174/68.5, 317/101 CE
[51] Int. Cl............................................. H05k 5/00
[58] Field of Search...... 174/68.5, 88 R; 317/101 B, 317/101 CE, 101 D, 101 DH; 339/17 F, 17 LC, 18 C, 19

[56] References Cited

UNITED STATES PATENTS 3,727,168 4/1973 Henschen et al................. 339/17 F

*Primary Examiner*—Darrell L. Clay
*Attorney, Agent, or Firm*—R. F. Van Epps

[57] ABSTRACT

A plurality of printed wiring cards each having a conventional rear connector portion for insertion into one of a plurality of electronic equipment frames and first and second front access connector portions on which a predetermined plurality of electrical contacts at first selected positions on the upper portion are connected by the printed conductor pattern to a corresponding plurality of contacts on the rear connector portion and to a corresponding plurality of electrical contacts at second selected positions on the lower portion. A flat printed cable is connected from the upper connector portion of one wiring card to the lower connector portion of another wiring card in an adjacent electronic equipment frame to thereby couple said predetermined plurality of contacts at the rear connector portion of each of said plurality of wiring cards to a terminating location.

4 Claims, 2 Drawing Figures

APPARATUS FOR INTERCONNECTING A PLURALITY OF ELECTRONIC EQUIPMENT FRAMES

BACKGROUND OF THE INVENTION

1. Field of the Invention

The present invention relates generally to the field of electronic equipment interconnection apparatus and more particularly to a new and improved printed wiring card and cable arrangement for coupling conductors from a plurality of electronic equipment frames.

2. Description of the Prior Art

In many electronic systems it is necessary to connect a predetermined number of conductors from each of a plurality of equipment frames to another equipment frame. The number of frames to be interconnected in this manner is a function of the system size and, therefore, could increase in time.

Prior to the present invention jumper cables using flexible printed circuitry have found common use in the interconnection of electronic equipment frames. One such jumper is described in U.S. Pat. No. 3,296,365 which issued to R. F. Basile on Jan. 3, 1967. That cable is configured such that each end of the cable is inserted into a connector on separate frames to thereby provide the interconnection.

A shortcoming of this type of jumper cable arises in that it must be inserted into a connector which is typically mounted at the rear of the equipment frame. With modern high density electronic packaging techniques insertion and extraction of this type of connector arrangement may be difficult. Further in applications where it is necessary to connect a predetermined number of leads from each of a plurality of frames to a terminating frame it has typically required a separate jumper cable from each of the individual frames to the terminating frame. It has heretofore required relatively complex circuitry to avoid the multiple jumpers by interconnecting adjacent frames in mechanical (vis-a-vis electrical) series.

OBJECTS AND SUMMARY OF THE INVENTION

From the preceding discussion it will be understood that among the various objectives of the present invention are included the provision of a new and improved apparatus for interconnecting a plurality of electronic equipment frames.

the provision of apparatus of the above-described character employing flexible printed cable and a front accessing connector arrangement; and the provision of apparatus of the above-described character wherein printed wiring cards having a uniform wiring pattern are used to couple a predetermined number of leads from each of a plurality of equipment frames to a terminating frame.

The foregoing as well as other objects of the present invention are efficiently achieved by providing a painted wiring card for each frame to be interconnected. Each such wiring card has first and second front access connector portions on which a predetermined plurality of connections grouped on the upper portion appear as the lowermost connections on the lower portion. The remaining groups of connections on the upper portion appear at correspondingly higher positions on the lower portion. Flat printed cable is then used to interconnect the upper connector portion of each wiring card with the lower connector portion of the adjacent wiring card and thence to the terminating frame.

These and other objects, features and advantages of the present invention will become more apparent from the following detailed description taken in conjunction with the appended drawings.

DESCRIPTION OF THE PREFERRED EMBODIMENT

Figure 1:
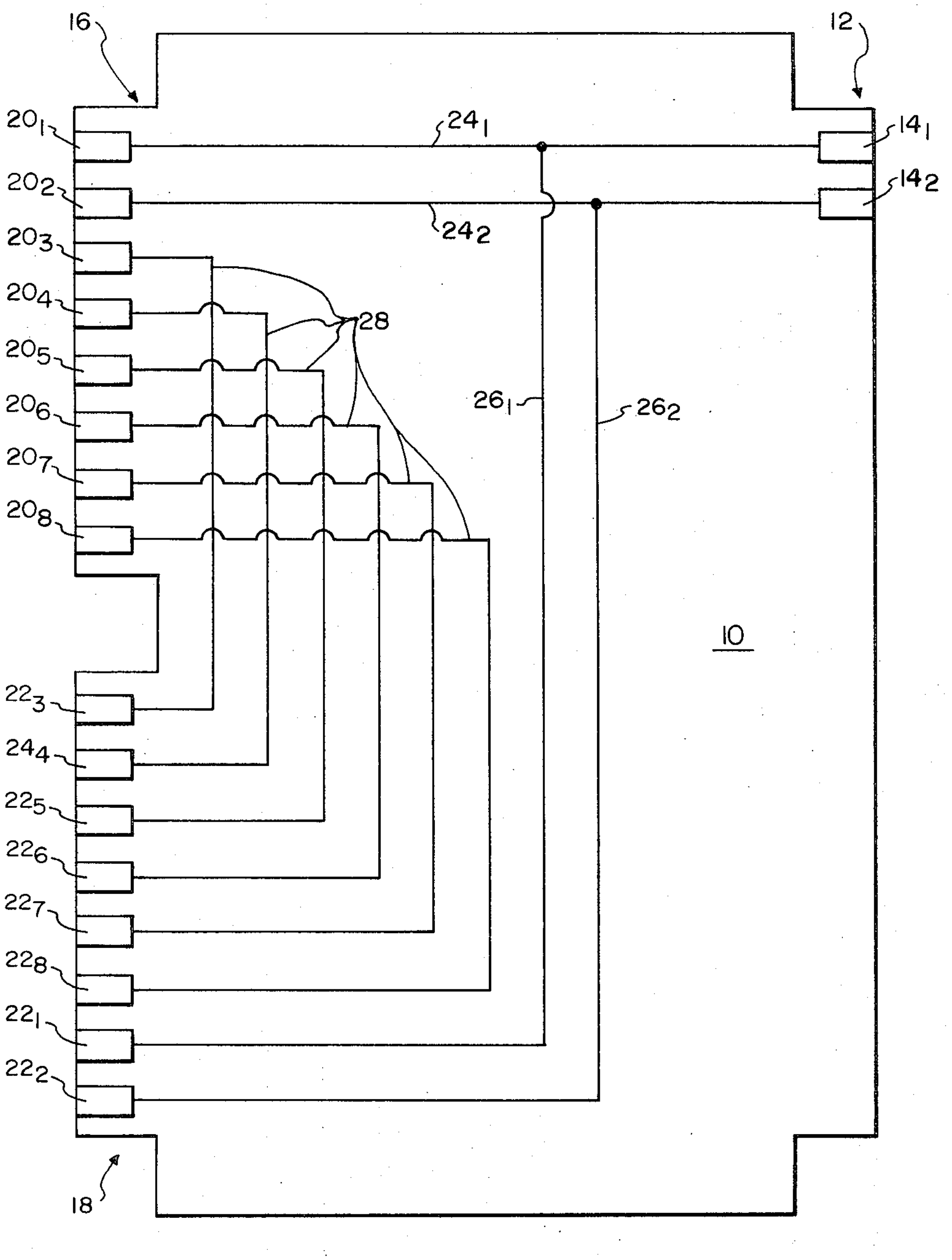
FIG. 1 is a schematic representation of a printed wiring card construction which is of utility in the practice of the present invention.

Turning now to FIG. 1 there is shown a printed wiring card in accordance with the present invention. In this illustrative embodiment two leads may be coupled from each of four electronic equipment frames. It will be understood, however, that the principles of the invention are equally applicable to the coupling of any number of leads, $n$, from any number of separate equipment frames, $m$.

The printed wiring card 10 has rearward connector area 12 having two electrical contacts $\mathbf{14}_{1\text{-}2}$ disposed thereon such that the card may be inserted into and contact two contacts of a connector (not shown) of an electronic frame. The wiring card 10 is also provided with first and second front access connector portions 16 and 18, each having a total of eight (or $n \times m$) electrical contacts, $\mathbf{20}_{1\text{-}8}$ and $\mathbf{22}_{1\text{-}8}$, respectively, disposed thereon. The uppermost pair (or group of $n$) contacts $\mathbf{20}_{1\text{-}2}$ on the first connector area 16 are connected respectively by printed circuits $\mathbf{24}_{1\text{-}2}$ to the contacts $\mathbf{14}_{1\text{-}2}$ on the rearward connector area 12 and by printed circuits $\mathbf{26}_{1\text{-}2}$ to the lowermost pair (or group of $n$) contacts $\mathbf{22}_{1\text{-}2}$ on the second connector area 18. Each of the remaining contacts $\mathbf{20}_{3\text{-}8}$ on the first connector area 16 are connected by printed conductors 28 to a corresponding contact $\mathbf{22}_{3\text{-}8}$ on the second connector area 18, each contact being shifted upwardly by two (or $n$) positions relative to corresponding position on the upper connector portion. It is this type of printed wiring arrangement which may be used in each of the electronic equipment frames to be interconnected as will be presently described.

It will be apparent that, if desired, the interconnection capacity of a given printed wiring card may easily be doubled by using a conductor pattern on both sides of the card 10. By way of illustration, the wiring pattern shown in FIG. 1, if employed on both sides of the wiring card could connect four leads from each of eight frames or two leads from each of 16 frames.

Figure 2:
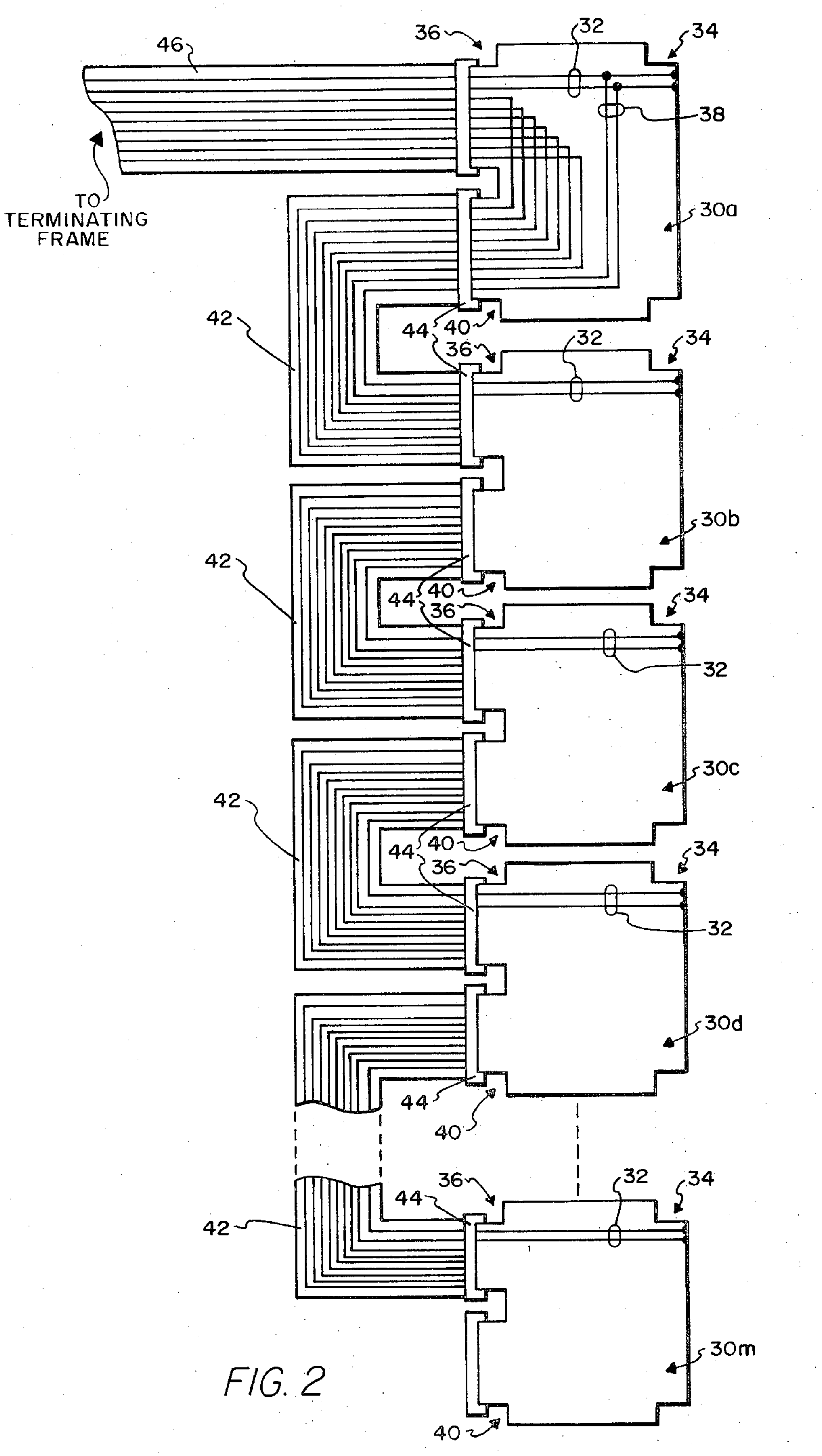
FIG. 2 is a schematic illustration of an arrangement using the wiring card of FIG. 1 to interconnect a plurality of electronic equipment frames.

The manner in which electronic equipment frames may be interconnected using the principles of the present invention is schematically illustrated in FIG. 2. As stated hereinabove it is a primary purpose of the present invention to couple $n$ leads from each of $m$ equipment frames to a terminating frame. To this end one printed wiring card 30 is inserted into an appropriate connector (not shown) in each equipment frame. Each wiring card 30 has a circuit pattern 32 which couples the desired group of $n$ leads from the rear connector portion 34 of the card to a corresponding group of $n$ contacts comprising the uppermost group on the first or upper front access connector area 36 of the wiring card. This group of $n$ leads is also coupled via circuit pattern 38 to the lowermost group of $n$ contacts on the second or lower front access connector area 40.

The wiring cards 30 inserted into each of the equipment frames are interconnected by an interframe jumper cable. In the preferred embodiment a flat printed wiring cable 42 having a connector 44 at each end and an appropriate plurality of parallel conductors is used to connect the first front access connector portion 36 of each printed wiring card; e.g. $\mathbf{30}_b$ to the second front access connector 40 of the wiring card; e.g. $\mathbf{30}_a$ in the next adjacent equipment frame. Each of the desired plurality of adjacent equipment frames are thus interconnected one to the next. Finally, the wiring card $\mathbf{30}_a$ in the last equipment frame is connected from its first or upper front access connector area 36 via jumper cable 46 to the terminating frame (not shown).

It will be noted that if wiring cards having circuit patterns on both surfaces are used a corresponding double sided cable connector is necessary as is a double capacity cable having one or more circuit layers.

From the printed wiring card arrangement shown in FIG. 1 and the inter-frame cabling arrangement shown in FIG. 2 it will be seen that the leads connected to contacts $\mathbf{14}_{1\text{-}2}$ of wiring card $\mathbf{30}_m$ will be coupled from upper contacts $\mathbf{20}_{1\text{-}2}$ of that card to lower contacts $\mathbf{22}_{3\text{-}4}$ of the adjacent wiring card $\mathbf{30}_d$. These paths will continue via printed circuits 28 to upper contacts $\mathbf{20}_{3\text{-}4}$ of card $\mathbf{30}_d$ and an additional two leads from wiring card $\mathbf{30}_d$ will occupy the upper two front access contacts $\mathbf{20}_{1\text{-}2}$. Printed cable 42 then couples upper contacts $\mathbf{20}_{1\text{-}4}$ to the upper four contacts $\mathbf{22}_{3\text{-}6}$ on the lower connector portion of wiring card $\mathbf{30}_c$. The circuitry of card $\mathbf{30}_c$ provides a conductive path to upper front contacts $\mathbf{20}_3$-$\mathbf{20}_8$ and two additional leads are coupled to upper front contacts $\mathbf{20}_{1\text{-}2}$. Finally printed wiring cable 46 couples all of the leads from all of the individual equipment frames to a terminating frame or other desired utilization means (not shown). Thus as each equipment frame is connected to the next adjacent frame the desired number of additional leads are coupled to the interframe cable while remaining electrically isolated from one another; i.e., no lead from any given frame is electrically coupled to any other except the terminating frame.

Through the practice of the Applicant's invention the requirement of individual jumper cables between each equipment frame and the terminating frame is avoided and the amount of jumper cable required is held to a minimum. Through the use of front access pluggable cable connections the expansion of a system to include additional equipment frames is facilitated. It will be seen that it is only necessary to provide printed wiring cards which have a number of front contacts on each of the connector portions equal to the number of leads desired to be coupled from each frame times the maximum number of frames which a given system is anticipated to use.

From the preceding description it will be understood that the Applicant has provided a new and novel apparatus for interconnecting electronic equipment frames whereby the objectives set forth hereinabove are efficiently achieved. Since certain changes in the above-described construction will occur to those skilled in the art without departure from the scope of the invention it is intended that all matter contained in the description or shown in the appended drawings shall be interpreted as illustrative and not in a limiting sense.

Having described what is new and novel and desired to secure by Letters Patent, what is claimed is:

1. Apparatus coupling $n$ electrical leads from each of a plurality of $m$ electronic equipment frames, said apparatus comprising a printed wiring card having first and second front access connector portions each having $n \times m$ electrical contacts thereon, a rear connector portion with $n$ electrical contacts thereon coupled to electrical leads of said frame, a first printed circuit pattern connecting said $n$ electrical contacts of said rear connector portion to $n$ corresponding contacts at first preselected positions on said first front access connector portion, a second printed circuit pattern connecting said $n$ contacts of said first front access connector portion to corresponding contacts at second preselected positions on said second front access connector portion, a third printed circuit pattern connecting the remainder of said contacts on said first front access connector portion to the remainder of said contacts on said second front access connector portion, and the positions of contacts on said first connector portion being shifted by $n$ positions with respect to the corresponding contact positions on said second connector portion, a plurality of $m$-$l$ jumper cables coupling electrical contacts on said first front access connector portion of the printed wiring card in each frame to electrical contacts at corresponding positions on said second front access connector portion of the printed wiring card in the adjacent frame, and a terminating cable coupling said $n$ electrical leads from the first front access connector portion of the printed wiring card in the last said frame.

2. Apparatus as recited in claim 1 wherein said $n$ electrical contacts of said rear connector portion are connected to the uppermost $n$ corresponding contacts of said first front access connector portion, said $n$ electrical contacts of said first front access connector portion are connected to the lowermost $n$ corresponding contacts of said second front access connector portion, and said remainder of the contacts of said first front access connector portion are connected to corresponding contacts of said second front access connector portion which are shifted upwardly by $n$ positions with respect to the positions of said contacts of said first front access connector portion.

3. Apparatus as recited in claim 2 wherein said jumper cables each comprise a flexible printed cable having $m \times n$ parallel conductors coupling the uppermost contacts of the first front access connector portion of the printed wiring card in each said frame to the uppermost contacts of the second front access connector portions of the printed wiring card in an adjacent frame.

4. Apparatus as recited in claim 1 wherein said terminating cable comprises a flexible printed cable having $m \times n$ parallel conductors.

* * * * *